United States Patent
Yamakage et al.

(10) Patent No.: US 10,980,161 B2
(45) Date of Patent: Apr. 13, 2021

(54) WORK ALLOCATION DEVICE

(71) Applicant: FUJI CORPORATION, Chiryu (JP)

(72) Inventors: Yusuke Yamakage, Anjoh (JP); Hidenori Goto, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 34 days.

(21) Appl. No.: 15/755,873

(22) PCT Filed: Sep. 1, 2015

(86) PCT No.: PCT/JP2015/074891
§ 371 (c)(1),
(2) Date: Feb. 27, 2018

(87) PCT Pub. No.: WO2017/037879
PCT Pub. Date: Mar. 9, 2017

(65) Prior Publication Data
US 2018/0249609 A1    Aug. 30, 2018

(51) Int. Cl.
*H05K 13/08* (2006.01)
*G05B 19/418* (2006.01)

(52) U.S. Cl.
CPC ....... *H05K 13/08* (2013.01); *G05B 19/41865* (2013.01); *H05K 13/085* (2018.08); *G05B 2219/45031* (2013.01)

(58) Field of Classification Search
CPC .......................................... G05B 2219/37605
USPC ................................................. 700/100, 112
See application file for complete search history.

(56) References Cited

U.S. PATENT DOCUMENTS

| | | | | |
|---|---|---|---|---|
| 2002/0069525 A1* | 6/2002 | Hada | .................. | H05K 13/0853 29/834 |
| 2005/0072831 A1* | 4/2005 | Haji | .................. | H05K 13/0812 228/102 |
| 2006/0119118 A1* | 6/2006 | Hata | .................. | H05K 13/0409 294/183 |

(Continued)

FOREIGN PATENT DOCUMENTS

| | | | |
|---|---|---|---|
| JP | 4-328900 A | | 11/1992 |
| JP | 4161748 B2 | | 10/2008 |

(Continued)

OTHER PUBLICATIONS

Schreiber Translations, Inc., USPTO provided human perfomed English translation of Japanese Patent Publilcaion JP2012238705 to Matsushita, Sep. 2020, 59 Pages (Year: 2020).*

(Continued)

*Primary Examiner* — Emilio J Saavedra
(74) *Attorney, Agent, or Firm* — Oblon, McClelland, Maier & Neustadt, L.L.P.

(57) ABSTRACT

A CPU of a management computer, when a work allocation processing routine is started, first, acquires a specified accuracy of each mounter, then acquires required accuracies of component types for components from a first to a last component to be mounted on a single board. Next, the CPU of the management computer performs allocation of mounting work of components from the first to the last component, and then ends the routine. Specifically, the CPU, for each component, allocates the mounting work of a given component to a mounter with a specified accuracy that satisfies the required accuracy for that component type.

8 Claims, 5 Drawing Sheets

| Mounter | Accuracy of mounter itself | Accuracy of auto-tool | Specified accuracy |
|---|---|---|---|
| 11A | High | High | Rank 3 |
| 11B | Medium | Low | Rank 2 |
| 11C | Medium | Low | Rank 2 |
| 11D | Low | Low | Rank 1 |

(56) References Cited

U.S. PATENT DOCUMENTS

2010/0152877 A1* 6/2010 Maenishi ............ H05K 13/0413
700/108
2010/0325860 A1* 12/2010 Maenishi ............. H05K 13/085
29/407.01

FOREIGN PATENT DOCUMENTS

| JP | 4813444 B2 | * | 11/2011 |
| JP | 2012238705 A | * | 12/2012 |
| JP | 5675487 B2 | | 2/2015 |

OTHER PUBLICATIONS

Schreiber Translations, Inc., USPTO provided human performed English translation of Japanese Patent No. JP4813444 to Suzuki et al., Sep. 2020, 58 pages (Year: 2020).*

International Search Report dated Dec. 8, 2016 in PCT/JP2015/074891 filed Sep. 1, 2015.

* cited by examiner

FIG. 5

| Mounter | Accuracy of mounter itself | Accuracy of auto-tool | Specified accuracy |
|---|---|---|---|
| 11A | High | High | Rank 3 |
| 11B | Medium | Low | Rank 2 |
| 11C | Medium | Low | Rank 2 |
| 11D | Low | Low | Rank 1 |

FIG. 6

| Part type | Required accuracy |
|---|---|
| PA | Rank 1 |
| PB | Rank 1 |
| PC | Rank 1 |
| PD | Rank 2 |
| PE | Rank 3 |
| ⋮ | ⋮ |

FIG. 7

| Sequence D1 | | |
|---|---|---|
| Mounting order | Part type | Component mounting position |
| 1 | PA | a |
| 2 | PA | b |
| 3 | PC | c |
| 4 | PE | d |
| ⋮ | ⋮ | ⋮ |

WORK ALLOCATION DEVICE

TECHNICAL FIELD

The present application relates to a work allocation device.

BACKGROUND ART

Conventionally, there are known component mounters that use a pickup section to pick up a component supplied by a component supply unit, transport the component above a board, and mount the component at a specified mounting position on the board. For example, disclosed in patent literature 1 is a component mounter of this type that determines required accuracy according to factors such as type of process, type, and size of component, and the like, and controls positioning waiting time of the head, and moving speed and moving acceleration of the head for movement during processing, based on the determined required accuracy.

CITATION LIST

Patent Literature

Patent literature 1: JP-A-H4-328900

BRIEF SUMMARY

Technical Problem

However, with patent literature 1, although it is disclosed to control operation of a head in accordance with a required accuracy, not disclosed is a point related to how mounting work of each component is to be allocated to multiple mounters that configure a component mounting line.

The present disclosure solves the above problems, and an object thereof is to suitably allocate mounting work of components to each of multiple mounters that configure a component mounting line.

Solution to Problem

A work allocating device of the present disclosure is for allocating mounting work of components to each of multiple mounters that configure a component mounting line, the work allocating device including:
a specified accuracy acquiring means configured to acquire a specified component mounting accuracy of each of the mounters;
a required accuracy acquiring means configured to acquire a required component mounting accuracy, the required component mounting accuracy being set based on at least one of a type of the component to be mounted or a mounting position on the board of the component to be mounted; and
an allocating means configured to allocate the mounting work of the components to each of the mounters based on the required component mounting accuracy and the specified component mounting accuracy.

With this work allocating device, the required component mounting accuracy set based on at least one of a type of the component to be mounted or a mounting position on the board of the component to be mounted is acquired, and mounting work of components is allocated to each of the mounters based on the acquired required component mounting accuracy and the specified component mounting accuracy of each of the mounters. That is, mounting work of components with a high required accuracy is allocated to a mounter with a high specified accuracy, and mounting work of components with a low required accuracy is allocated to a mounter with a low specified accuracy. Therefore, it is possible to suitably allocate mounting of components to each of multiple mounters that configure a component mounting line.

With a work allocating device of the present disclosure, the specified component mounting accuracy may be at least one of an ability of the mounter itself or an ability of a head loaded on the mounter. An example of an ability of the mounter itself is the mechanical accuracy of the X-axis slider and Y-axis slider provided on the mounter. With regard to an ability of a head loaded on the mounter, for example, when comparing a head with a rotary type tool equipped with multiple nozzles and a head with a single nozzle, because the single nozzle head has fewer moving sections, in general the accuracy of the single nozzle head is better. Also, in general the accuracy is better when vertical movement of a nozzle is guided using a bearing compared to a case without using a bearing.

A work allocating device of the present disclosure may further comprise a required accuracy setting means configured to automatically set the required component mounting accuracy based on at least one of the type of the component to be mounted or the mounting position on the board of the component to be mounted, wherein the required accuracy acquiring means acquires the required component mounting accuracy that is set by the required accuracy setting means. Accordingly, even in a case in which the required accuracy is not set in the data of a component to be mounted, the required accuracy can be automatically set based on the type and mounting position of the component, making the present disclosure applicable for these components too.

With a work allocating device of the present disclosure provided with a required accuracy setting means, the required accuracy setting means, when automatically setting the required component mounting accuracy based on the mounting position on the board of the component to be mounted, may automatically set the required component mounting accuracy to be a higher accuracy the smaller a distance is between the mounting position on the board of the component to be mounted and a component already mounted or to be mounted nearby the component to be mounted. Accordingly, if the component spacing distance is small, the required accuracy will be set to a high accuracy, therefore, when mounting the component, interference will be unlikely to occur between the component and nearby components.

With a work allocating device of the present disclosure, at least one of the multiple mounters may include multiple work modes with different accuracies, and the allocating means may be configured to, when allocating the mounting work of the components to each of the mounters, allocate mounting work of the components considering a tact during each of the work modes for the mounters that have the multiple work modes. Accordingly, mounting work of components is allocated such that the abilities of the mounter that includes multiple work modes are sufficiently exploited.

BRIEF DESCRIPTION OF DRAWINGS

FIG. 5 is a table showing relationships between component mounters and specified accuracies.

FIG. 6 is a table showing relationships between component types and required accuracies.

FIG. 7 illustrates sequence data.

DESCRIPTION OF EMBODIMENTS

Figure 1:
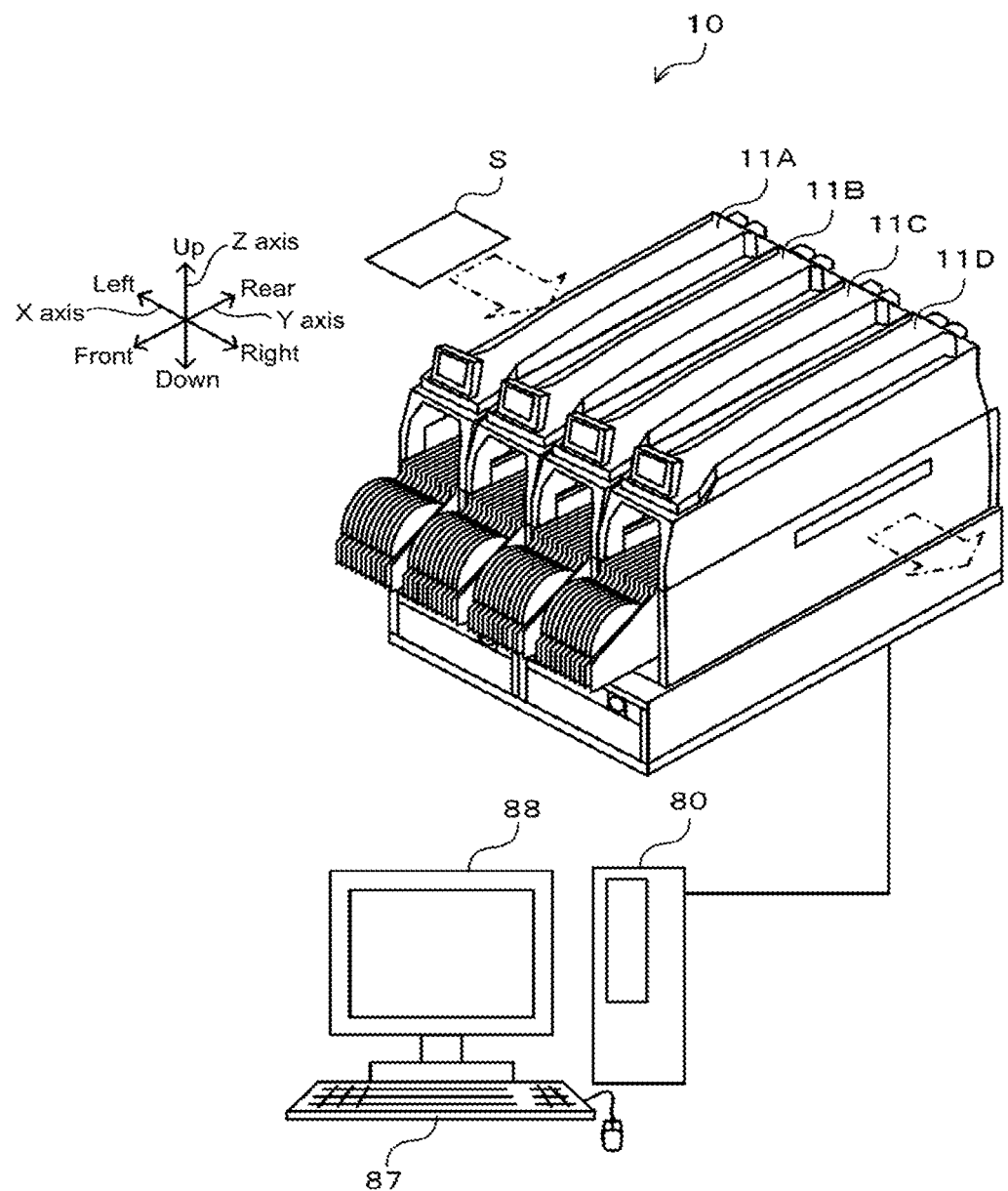
FIG. 1 shows an outline of the configuration of component mounting line 10.
Figure 2:
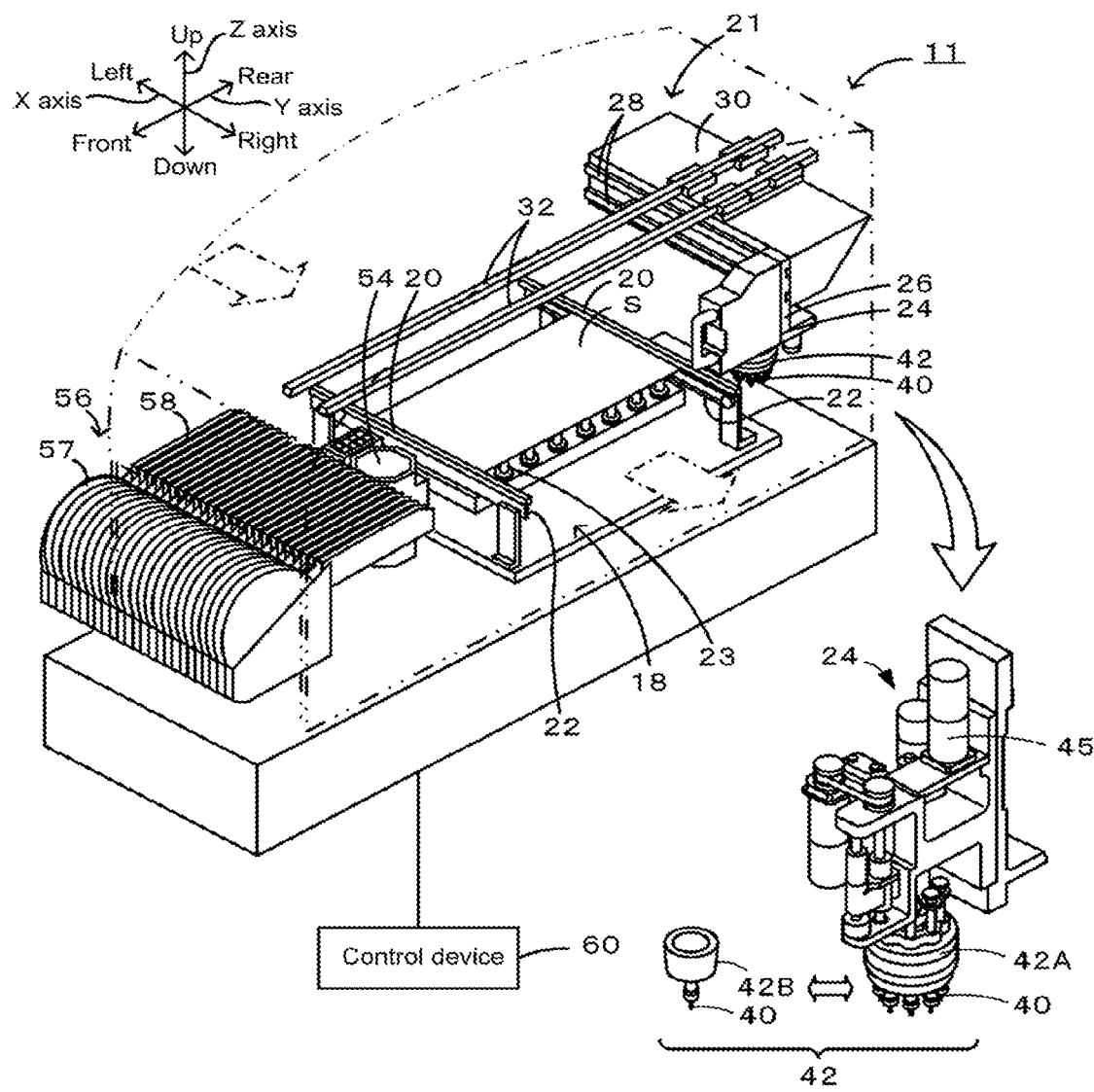
FIG. 2 shows an outline of the configuration of mounter 11.

A suitable embodiment of the present disclosure is described below with reference to the figures. FIG. 1 shows an outline of the configuration of component mounting line 10, and FIG. 2 shows an outline of the configuration of mounter 11. For the present embodiment, in FIGS. 1 and 2, the left/right direction is the X-axis direction, the front/rear direction is the Y-axis direction, and the up/down direction is the Z-axis direction.

Component mounting line 10 is provided with multiple mounters 11A to 11D that perform processing of mounting components on board S, and management computer 80 that performs overall production management of the entire system such as management of each mounter 11A to 11D. Because each mounter 11A to 11D has substantially the same configuration, unless there is a particular need, they are collectively referred to as mounter 11.

As shown in FIG. 2, mounter 11 is provided with conveyance section 18 that conveys board S, pickup section 21 that picks up components, reel unit 56 that supplies components, and control device 60 that performs overall device control. Conveyance section 18 is provided with support plates 20 and 20 arranged with a gap between them in the front-rear direction of FIG. 2 and extending in the left-right direction, and conveyor belts 22 and 22 provided on surfaces of both supporting plates 20 and 20 that face each other. Conveyor belts 22 and 22 are endlessly supported on drive wheels and driven wheels provided on the left and right of support plates 20 and 20. Board S is placed on the top surfaces of the pair of conveyor belts 22 and 22 and is conveyed from left to right. Board S is supported from underneath by many support pins 23.

Pickup section 21 is provided with items such as mounting head 24, X-axis slider 26, and Y-axis slider 30. Mounting head 24 is attached to a front surface of X-axis slider 26. X-axis slider 26 is attached to the front surface of Y-axis slider 30, which is slidable in the front-rear direction, so as to be slidable in the left-right direction. Y-axis slider 30 is slidably attached to a pair of guide rails 32 and 32 that extend in the front-rear direction. Note that, guide rails 32 and 32 are fixed to an internal section of mounter 11. Guide rails 28 and 28 that extend in the left-right direction are provided on the front surface of Y-axis slider 30, and X-axis slider 26 is attached to these guide rails 28 and 28 so as to be slidable in the left-right direction. Mounting head 24 moves in the left and right directions based on the moving in the left and right directions of X-axis slider 26, and moves in the front and rear directions based on the moving in the front and rear directions of Y-axis slider 30. Note that, each slider 26 and 30 is driven by a drive motor, which are not shown.

Mounting head 24 is provided with exchangeable auto-tool 42A or 42B that include at least one nozzle 40 that picks up a component. Note that, when it is not necessary to distinguish between auto-tools 42A and 42B, they are collectively referred to as auto-tool 42. Auto-tool 42A is provided with twelve nozzles 40. Auto-tool 42B is provided with one nozzle 40. With auto-tool 42A, the configuration is such that nozzle 40 slides directly inside a sleeve that extends vertically, while with auto-tool 42B, the configuration is such that nozzle 40 slides in a state supported by a bearing. Therefore, compared to nozzle 40 of auto-tool 42A, nozzle 40 of auto-tool 42B slides up and down more smoothly, and therefore has better operation accuracy. Also, auto-tool 42A includes a mechanism for revolving nozzles 40 by rotating a cylindrical body of auto-tool 42A and a mechanism for rotating nozzles 40 on their own axes, whereas auto-tool 42B includes a mechanism for rotating nozzle 40 on its own axis by rotating a cylindrical body. Thus, because auto-tool 42B has fewer moving sections, the play is smaller compared to auto-tool 42A, thus operation accuracy is better. Nozzle 40 uses pressure to pick up and release a component at the nozzle tip. Nozzle 40 is raised/lowered in the Z-axis direction (up/down direction), which is perpendicular to the X-axis and Y-axis directions, by a holder raising/lowering device that has Z-axis motor 45 as a drive source. Note that, the component holding member that holds and releases a component is described here as nozzle 40 that picks up and releases a component by suction and canceling the suction, but the configuration is not limited to this, for example, the component holding member may be a mechanical chuck.

Reel unit 56 is provided with multiple reels 57 around which is wound tape housing components, with reel unit 56 being removably attached to a front side of mounter 11. The tape is unwound from reel 57 and is fed by feeder section 58 to a pickup position at which pickup is performed by mounting head 24. Component camera 54 is arranged in front of support plate 20 on the front side of conveyance section 18. The imaging range of component camera 54 is above component camera 54. When nozzle 40 holding a component passes above component camera 54, component camera 54 images the state of the component held by nozzle 40 and outputs the image to control device 60.

Figure 3:
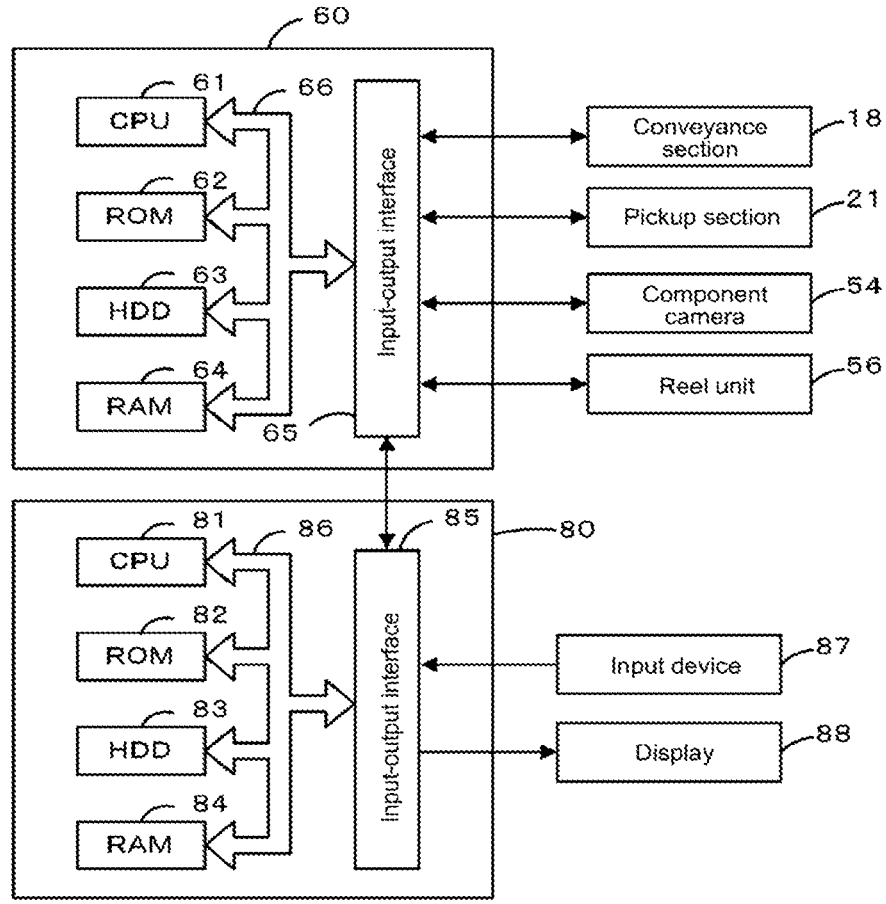
FIG. 3 is a block diagram showing electrical connections of control device 60 and management computer 80.

As shown in FIG. 3, control device 60 is configured from a microprocessor based around CPU 61, ROM 62 that memorizes a processing program, HDD 63 that memorizes various data, RAM 64 used as working memory, input-output interface 65 for performing communication of electric signals with external devices, and so on, and these are connected by bus 66. Control device 60 is connected to items such as conveyance section 18, pickup section 21, component camera 54, and reel unit 56 such that two-way communication is possible. Each slider 26 and 30 is provided with position sensors, which are not shown, and control device 60 controls drive motors of sliders 26 and 30 while receiving position information from the position sensors.

As shown in FIG. 3, management computer 80 is provided with items such as a microprocessor centered around CPU 81, ROM 82 that memorizes a processing program, HDD 83 that memorizes various information, RAM 84 used as working memory, and input-output interface 85 for performing two-way communication with control devices 60 of each mounter 11, and these are connected by bus 86. Management computer 80 is connected to be capable of receiving input of signals from input device 87 such as a mouse or a keyboard and of outputting various images to display 88 via input-output interface 85.

Next, operation of the embodiment of component mounting line 10 configured as above is described. Here, descriptions are given for processing of management computer 80 allocating mounting work of components to be mounted on a single board S to each of mounters 11A to 11D. Components to be mounted on the board S are numbered from a first to a last component. The numbers do not represent the mounting order, they are simply used to distinguish the components.

Figure 4:
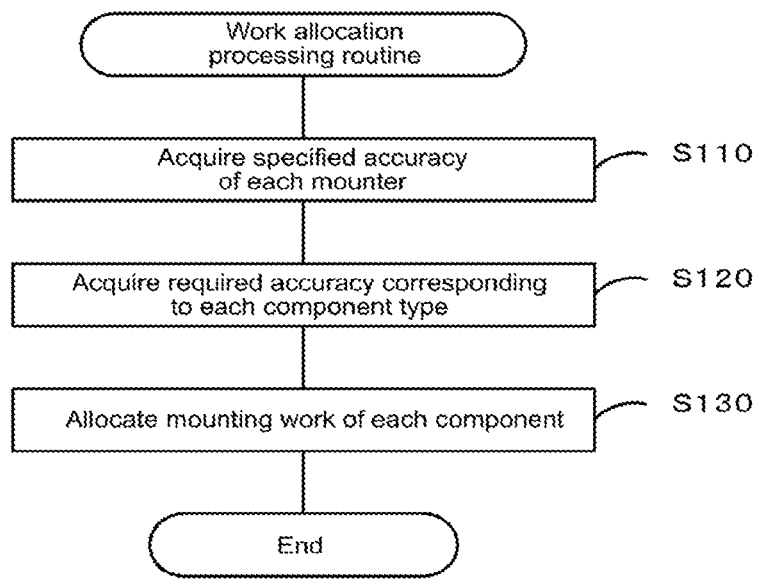
FIG. 4 is a flowchart showing an example of a work allocation processing routine.

As shown in FIG. 1, all the components that are planned to be mounted on one board S are mounted on the board S by performing successive mounting of components at the four mounters 11A to 11D that configure component mounting line 10. That is, all the components are mounted on the board S between when it is loaded inside component mounting line 10 at the loading window on the left side and when it is unloaded from the unloading window on the right side. Here, component mounting sequences are set for each of the mounters 11, in this case four. CPU 81 of management computer 80, before setting sequences to each mounter 11, performs a work allocation processing routine that decides to which mounter 11 which component mounting work is allocated. FIG. 4 is a flowchart showing an example of this routine. This routine is memorized on HDD 83 of management computer 80 and is performed based on a start command from an operator.

CPU 81 of management computer 80, when the work allocation processing routine is started, first, acquires the specified accuracy of each mounter 11A to 11D (step S110). The specified accuracy is determined by both the accuracy of the mounter 11 itself and the accuracy of the auto-tool 42 loaded on the mounting head 24 of the mounter 11. For example, with regard to the mechanical accuracy of the X-axis and Y-axis sliders 26 and 30 of mounters 11A to 11D, as shown in FIG. 5, this is high for mounter 11A, medium for mounters 11B and 11C, and low for mounter 11D. Note that, the mechanical accuracy may be higher the smaller the minimum movement amount (resolution) of a slider is. Also, auto-tool 42B is loaded on mounting head 24 of mounter 11A, and auto-tool 42A is loaded on mounting head 24 of mounters 11B to 11D. As described above, auto-tool 42B can mount components with a higher accuracy than auto-tool 42A. Therefore, the accuracy of auto-tools 42, as shown in FIG. 5, is high for mounter 11A and low for mounters 11B to 11D. In this case, the specified accuracy of mounters 11A to 11D depends on both the accuracy of the mounter 11 itself and the accuracy of the auto-tool 42 loaded on mounting head 24, and may be set such as shown in FIG. 5. Ranks 1 to 3 of the specified accuracy represent a higher level of accuracy the higher the value of the rank. The specified accuracy of mounters 11A to 11D may be acquired by CPU 81 communicating with control device 60 of each mounter 11A to 11D, or may be acquired by reading information memorized in advanced on HDD 83 of management computer 80.

Next, CPU 81 acquires the required accuracy corresponding to the type of the components for the first to last component (step S120). Here, the relationship between the component type and the required accuracy is decided as shown in FIG. 6 and memorized in advance on HDD 83 of management computer 80. That is, a required accuracy is set for each component type.

Next, CPU 81 performs allocation of mounting work of components from the first to the last component (step S130), and then ends the routine. Specifically, CPU 81, for each component, allocates the mounting work of a given component to a mounter 11 with a specified accuracy that satisfies the required accuracy for that component type. The relationships between the component types and the required accuracies are as shown in FIG. 6. For example, because the required accuracy for component type PE is rank 3, mounting work for those components is allocated to a mounter 11A for which the specified accuracy is the same rank, that is, rank 3. Because the required accuracy for component type PD is rank 2, mounting work for those components is allocated to one of the mounters 11A to 11C for which the specified accuracy is rank 2 or higher. For example, because the required accuracy for component types A to C is rank 1, mounting work for those components is allocated to one of the mounters 11A to 11D for which the specified accuracy is rank 1 or higher. Note that, allocation may be performed such that the quantity of components is allocated to mounters 11A to 11D is equalized as far as possible.

Next, CPU 81, for each mounter 11, determines the mounting operation order such that the allocated components are mounted in the optimum order. For example, the mounting order may be determined such that the sequence processing time is minimized. Examples of sequences created by CPU 81 are shown in FIG. 7. Sequence D1 corresponds to mounter 11A, sequence D2 to mounter 11B, sequence D3 to 11C, and sequence D4 to mounter 11D respectively.

Described next are operations of control device 60 of mounter 11 using nozzle 40 to pick up a component supplied by reel unit 56 and mount the component at a specified position on board S. First, CPU 61 of control device 60 picks up components using nozzles 40 of auto-tool 42 in accordance with the given sequence. In a case of auto-tool 42A that includes twelve nozzles 40, components of the first to twelfth mounting operations are picked up in order by nozzles 40 as auto-tool 42A is intermittently rotated. On the other hand, in a case of auto-tool 42B that includes one nozzle 40, the component of the first mounting operation is picked up by the nozzle 40. Next, CPU 61 controls X-axis and Y-axis sliders 26 and 30 of pickup section 21 to move mounting head 24 above component camera 54, and then images the components held by nozzles 40 using component camera 54. In a case of auto-tool 42A with twelve nozzles 40, the components held on all the nozzles 40 are imaged while intermittently rotating auto-tool 42A. On the other hand, in a case of auto-tool 42B with one nozzle 40, the component held by the single nozzle 40 is simply imaged. CPU 61 determines the orientation of the component by analyzing the captured image. Next, CPU 61 controls X-axis and Y-axis sliders 26 and 30 of pickup section 21 to move mounting head 24 above board S, and mounts the component held by nozzle 40 on board S. In a case of auto-tool 42A with twelve nozzles 40, components of the first to twelfth mounting operations are mounted in order at the mounting positions on board S as auto-tool 42A is intermittently rotated. On the other hand, in a case of auto-tool 42B with one nozzle 40, the single component is simply mounted at the mounting position on the board. CPU 61 repeatedly performs this work in accordance with the given sequences until all the planned components have been mounted on board S, and then unloads the board S for which work is complete to a downstream mounter 11.

Correspondences between constituent elements of the present embodiment and constituent elements of the disclosure will be clarified here. Management computer 80 of the present embodiment corresponds to the work allocating device of the present disclosure, CPU 81 of management computer 80 corresponds to the specified accuracy acquiring means, the required accuracy acquiring means, and the allocating means.

With management computer 80 of an embodiment above, the required accuracy set based on component type is acquired, and mounting work of components is allocated to each of the mounters 11A to 11D based on the acquired required accuracy and the specified accuracy of each of the mounters 11A to 11D. That is, mounting work of components with a high required accuracy is allocated to a mounter with a high specified accuracy, and mounting work of components with a low required accuracy is allocated to a mounter with a low specified accuracy. Therefore, it is possible to suitably allocate mounting of components to each of the mounters 11A to 11D that configure component mounting line 10.

Also, the specified accuracy of mounter 11 is determined by both an ability of the mounter 11 itself and an ability of the auto-tool 42 loaded on mounting head 24 of mounter 11. Therefore, the specified accuracy of mounter 11 is set appropriately.

Meanwhile, it goes without saying that the disclosure is not limited to the above-mentioned embodiment and various embodiments may be applied within the technical scope of the disclosure.

For example, in an embodiment above, as shown in FIG. 6, a required accuracy is set for each component type, but instead of this, a required accuracy may be set for each mounting position of the component on the board. For example, the required accuracy may be set as a high accuracy for mounting positions for which the clearance between mounting positions (component spacing distance) is small, and the required accuracy may be set as a low accuracy for mounting positions for which the clearance between mounting positions (component spacing distance) is large. Alternatively, the required accuracy may be set to both the component type and the mounting position at the same time (that is, may be set based on a combination of the component type and the mounting position).

In an embodiment above, management computer 80 memorizes the relationships between component types and required accuracies (table, refer to FIG. 6) on HDD 83, or acquires them from an external section, but in a case in which required accuracies are not set by component types, management computer 80 may automatically set the required accuracy for that component type. For example, CPU 81 of management computer 80 may read a size of a component type from HDD 83 or acquire that information from an external section, calculate with how much clearance a component will be arranged with respect to adjacent components based on the component types and mounting positions of the two adjacent components, and set the required accuracy based on the size of the clearance. For example, the required accuracy may be set to a low accuracy if the clearance is equal to or larger than a specified threshold, and the required accuracy may be set to a high accuracy if the clearance is less than the threshold. Accordingly, even in a case in which the required accuracy is not set for a component to be mounted, the required accuracy can be automatically set based on the type and mounting position of the component, making the present disclosure applicable for these components too. Also, if the clearance between the component to be mounted and an adjacent component is small, the required accuracy will be set to a high accuracy, therefore, when mounting the component, interference will be unlikely to occur between the component and adjacent components.

In an embodiment above, mounters 11A to 11D include multiple work modes with different accuracies, and CPU 81 of management computer 80, when allocating mounting work of components to each mounter 11A to 11D, may allocate mounting work considering a tact during each of the work modes. For example, mounter 11A may select from a high accuracy mode and a low accuracy mode. Mounter 11, in high accuracy mode, performs control such that the moving speed of mounting head 24 is slow, and such that the matching width between a position control target value and a measurement value stays within a narrow range (for example, ±5 pulses). Accordingly, component mounting time increases, but highly accurate component mounting is performed. On the other hand, with low accuracy mode, control is performed such that the moving speed of mounting head 24 is fast, such that the matching width between a position control target value and a measurement value stays within a wide range (for example, ±20 pulses). Accordingly, the accuracy of component mounting is not high, but component mounting time is shorter, and throughput is improved. For example, when allocating mounting work of components of component types PA to PC to mounter 11A, the required accuracy of component types PA to PC is rank 1 (refer to FIG. 6), that is, a low required accuracy, therefore, low accuracy mode can be selected to improve throughput. On the other hand, when allocating mounting work of components of component type PE to mounter 11A, the required accuracy of component types PE is rank 3, that is, a high required accuracy, therefore, high accuracy mode is selected, which takes time, but which has high accuracy. Accordingly, mounting work of components is allocated such that the abilities of mounter 11A that includes multiple work modes are sufficiently exploited.

In an embodiment above, management computer 80 is described as an example of a work allocating device of the present disclosure, but the configuration is not limited to this, for example, a computer may be provided separately to management computer 80 for allocating work.

INDUSTRIAL APPLICABILITY

The present disclosure may be used at a component mounting line in which multiple mounters are arranged, the mounters mounting a component supplied from a component supply device at a specified position on a board.

REFERENCE SIGNS LIST

D1 to D2: sequence; 10: component mounting line; 11, 11A to 11D: mounter; 18: conveyance section; 20: support plate; 21: pickup section; 22: conveyor belt; 23: support pin; 24: mounting head; 26: X-axis slider; 28: guide rail; 30: Y-axis slider; 32: guide rail; 40: nozzle; 42, 42A, 42B: auto-tool; 45: Z-axis motor; 54: component camera; 56: reel unit; 57: reel; 58: feeder section; 60: control device; 61: CPU; 62: ROM; 63: HDD; 64: RAM; 65: input-output interface; 66: bus; 80: management computer; 81: CPU; 82: ROM; 83: HDD; 84: RAM; 85: input-output interface; 86: bus; 87: input device; 88: display

The invention claimed is:

1. A work allocating device for allocating mounting work of components to each of multiple mounters that configure a component mounting line, the work allocating device comprising:
   a memory that stores a determined specified component mounting accuracy of each of the respective mounters determined based upon both a level of accuracy of a pickup section of the respective mounter and a level of accuracy of a tool exchangeably provided to a mounting head of the pickup section of the respective mounter; and
   processing circuitry configured to acquire from the memory the specified component mounting accuracy of each of the respective mounters;

acquire from the memory a required component mounting accuracy of respective components to be mounted, the required component mounting accuracy based on at least one of a type of the component to be mounted or a mounting position on a board of the component to be mounted; and allocate the mounting work of the components to each of the mounters based on the required component mounting accuracies and the specified component mounting accuracies.

2. The work allocating device according to claim 1, wherein the processing circuitry is configured to automatically set the required component mounting accuracy based on at least one of the type of the component to be mounted or the mounting position on the board of the component to be mounted.

3. The work allocating device according to claim 2, wherein when automatically setting the required component mounting accuracy based on the mounting position on the board of the component to be mounted, the processing circuitry automatically sets the required component mounting accuracy to be a higher accuracy as a distance between the mounting position on the board of the component to be mounted and a component already mounted or to be mounted nearby the component to be mounted is reduced.

4. The work allocating device according to claim 1, wherein at least one of the multiple mounters includes multiple work modes with different accuracies, and the processing circuitry is configured to, when allocating the mounting work of the components to each of the mounters, allocate mounting work of the components considering a tact during each of the work modes for the mounters that have the multiple work modes.

5. The work allocating device according to claim 1, wherein the tools include a first tool including a plurality of nozzles and a second tool including a single nozzle, and a level of accuracy of the second tool including the single nozzle is greater than a level of accuracy of the first tool including the plurality of nozzles.

6. The work allocating device according to claim 1, wherein the specified component mounting accuracy is a rank.

7. The work allocating device according to claim 1, wherein a specified component mounting accuracy of a first one of the mounters with movement guided using a bearing is greater than a specified component mounting accuracy of a second one of the mounters with movement guided without using a bearing.

8. The work allocating device according to claim 1, wherein a specified component mounting accuracy of a first one of the mounters with fewer moving sections is greater than a specified component mounting accuracy of a second one of the mounters with more moving sections that the first one.

* * * * *